US008729966B2

(12) United States Patent
Takagi

(10) Patent No.: US 8,729,966 B2
(45) Date of Patent: May 20, 2014

(54) VARIABLE GAIN AMPLIFIER CIRCUIT

(75) Inventor: Katsuyuki Takagi, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/358,525

(22) Filed: Jan. 26, 2012

(65) Prior Publication Data

US 2012/0206204 A1    Aug. 16, 2012

(30) Foreign Application Priority Data

Feb. 15, 2011    (JP) .................................. 2011-029566

(51) Int. Cl.
*H03G 3/12*    (2006.01)

(52) U.S. Cl.
USPC .......................................... 330/283; 330/278

(58) Field of Classification Search
USPC .................... 330/283, 311, 310, 278
See application file for complete search history.

(56) References Cited

U.S. PATENT DOCUMENTS

| 7,969,246 B1* | 6/2011 | An et al. ........................ 330/311 |
| 8,031,005 B2* | 10/2011 | Xiong et al. ................... 330/311 |
| 8,102,213 B2* | 1/2012 | Tasic et al. ..................... 330/283 |

FOREIGN PATENT DOCUMENTS

JP    2010-239401 A    10/2010

* cited by examiner

*Primary Examiner* — Henry Choe
(74) *Attorney, Agent, or Firm* — Rabin & Berdo, P.C.

(57) ABSTRACT

A variable gain amplifier circuit with a small-sized configuration can accurately adjust the gain without causing a transmission loss of an input signal. A plurality of amplification portions are connected with each other between an amplification coupling line and a grounding line in parallel. The amplification portion includes a switching device and an amplification transistor, which induces a current corresponding to an input signal to flow between the amplification coupling line and the grounding line via the switching device when the switching device is in the on state. The amplitude gain is varied by, according to a gain control signal, separately switching on and off the switching devices of the respective amplification portions.

20 Claims, 4 Drawing Sheets

VARIABLE GAIN AMPLIFIER CIRCUIT

BACKGROUND OF THE INVENTION

1. Technical Field

The present invention relates to a variable gain amplifier circuit that amplifies an input signal at variable gain.

2. Description of the Related Art

A receiver used in wireless mobile communications is, at its front end, provided with a variable gain amplifier circuit that varies a gain according to the level of a received signal in order to maintain the level of the received signal at a constant level even when radio attenuation is caused by, for example, the distance between the receiver and the base station and existence of an obstacle therebetween.

A variable gain amplifier circuit with a wider variable gain range is proposed (see FIG. 1 of Patent Literature 1). In the configuration of this circuit, collector terminals of a plurality of amplification transistors (Q1 to Qn), i.e., transistors that amplify a received signal, are connected with each other.

The base terminals of the amplification transistors are provided with switches (SW1-1 to SW1-$n$ and SW2-1 to SW2-$n$). According to the switch change-over signal corresponding to a gain control signal, each of the switches sets its state to receive or not to receive supply of a received signal ($Rf_{in}$). Specifically, a received signal is supplied to the base terminal of an amplification transistor connected to a switch set to receive supply of the received signal. Between the collector and emitter of this amplification transistor, an amplification current (Ic) corresponding to the received signal flows. On the other hand, the received signal is not supplied to the base terminal of an amplification transistor connected to a switch that is set not to receive the received signal. The aforementioned amplification current does not flow between the collector and emitter of this amplification transistor. With an increase in number of switches of the plurality of amplification transistors (Q1 to Qn) that are set to receive supply of a received signal, the amplification current flowing to each amplification transistor increases. With a decrease in number of switches of the plurality of amplification transistors with this setting, the amplification current flowing thereto decreases. The amplification gain of this variable gain amplifier circuit is varied by changing the number of amplification transistors that are set to receive supply of the received signal among the aforementioned plurality of amplification transistors.

One problem of this variable gain amplifier circuit is attenuation of a signal level. Specifically, the signal level is attenuated by the on resistance and parasitic capacitance of a switch existing in the transmission path of a received signal.

Another problem is that a desired gain cannot be achieved. The reason is that as the number of amplification transistors to be supplied with a received signal changes, the input impedance changes depending on the gain.

When the aforementioned switch of the variable gain amplifier circuit is set not to receive supply of a received signal, the grounding potential is forcedly applied to the base terminal of the amplification transistor. In practice, this switch is a two-input selector that selects one of the received signal and grounding potential according to a gain control signal and supplies the selected one to the amplification transistor. Another problem is a large size of the apparatus as such a two-input selector is provided for each amplification transistor.

Patent Literature 1: Japanese Patent Kokai No. 2010-239401

SUMMARY OF THE INVENTION

An object of the present invention is to provide a variable gain amplifier circuit with a small-sized configuration that can accurately adjust the gain without causing a transmission loss of an input signal.

The variable gain amplifier circuit according to the present invention sends out, via an output terminal, a signal that is obtained by amplifying an input signal supplied via an input terminal. The variable gain amplifier circuit includes a plurality of amplification portions provided in parallel between an amplification coupling line and a grounding line and an output portion that sends out a signal on the amplification coupling line to the output terminal. Each of the amplification portions includes a switching device connected between the amplification coupling line and the grounding line as well as an amplification transistor. When the switching device is in an on state, the amplification transistor induces a current corresponding to the input signal to flow between the amplification coupling line and the grounding line via the switching device. An input signal terminal of the amplification transistor is connected to the input terminal. The gain is varied by setting the switching device to the on state or an off state according to a gain control signal.

The variable gain amplifier circuit according to the present invention is provided with a plurality of amplification portions in parallel between the amplification coupling line and the grounding line. The amplification portion includes a switching device between the amplification coupling line and the grounding line and an amplification transistor which induces a current corresponding to an input signal to flow between the amplification coupling line and the grounding line via the switching device when the switching device is in the on state. The amplitude gain is varied by switching on and off the switching device according to the gain control signal.

In this configuration, a switching device for setting an amplification transistor to a deactivated state does not exist in the input signal line. Accordingly, attenuation of the input signal level, which is caused by the on resistance and parasitic capacitance of the switching device, can be prevented. As the input signal line is directly connected to the input signal terminal of each amplification transistor, changes in the input impedance caused by gain changes can be suppressed. As the error between the actual gain at the time of amplification by the amplification transistor and the designed gain can be thereby minimized, highly accurate gain adjustment can be performed.

DETAILED DESCRIPTION OF THE INVENTION

In the variable gain amplifier circuit according to the present invention, a plurality of amplification portions are connected with each other in parallel between an amplification coupling line and a grounding line. The amplification portion includes a switching device and an amplification transistor, which induces a current corresponding to an input signal to flow between the amplification coupling line and the grounding line via the switching device when the switching device is in the on state. The amplitude gain is varied by, according to a gain control signal, separately switching on or off the switching devices of the respective amplification portions.

Figure 1:
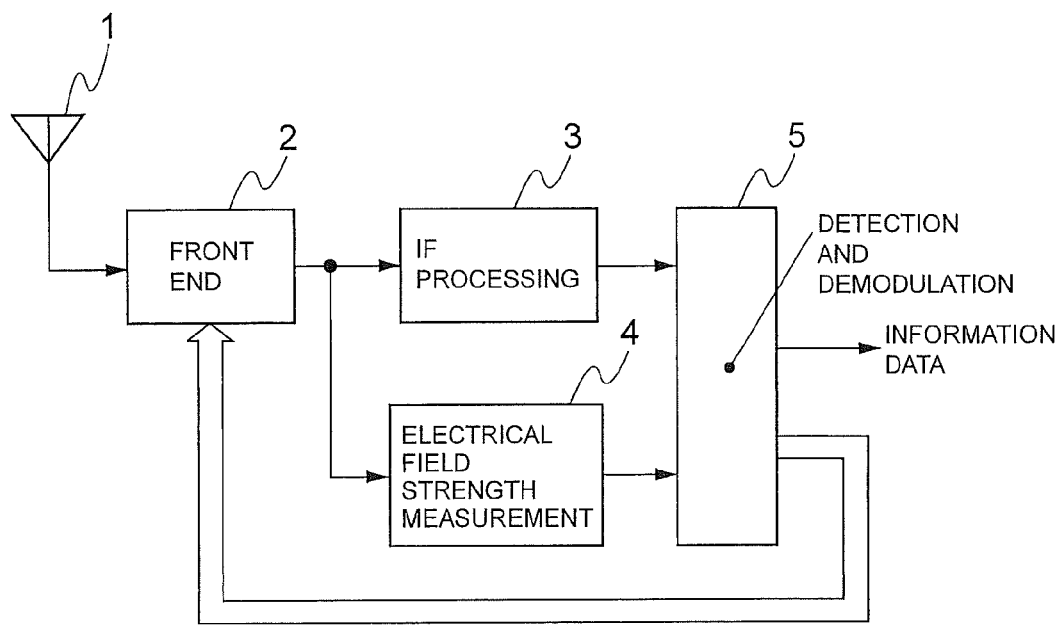
FIG. 1 is a block diagram illustrating a general configuration of a wireless receiver including a variable gain amplifier circuit according to the present invention.

FIG. 1 is a block diagram illustrating a general configuration of a wireless receiver including a variable gain amplifier circuit according to the present invention.

In FIG. 1, a front end 2 amplifies a received signal received by an antenna 1, converts the signal into an intermediate frequency signal, and supplies the converted signal to an IF processing portion 3 and an electrical field strength measuring portion 4. The IF processing portion 3 limits the bandwidth of the intermediate frequency signal to a predetermined bandwidth range and supplies the bandwidth-limited frequency signal to a detection and demodulation portion 5. Based on the intermediate frequency signal, the electrical field strength measuring portion 4 measures the electrical field strength of the received signal. In turn, the electrical field strength measuring portion 4 supplies the detection and demodulation portion 5 with a received electrical field strength signal which indicates the electrical field strength of the received signal. The detection and demodulation portion 5 detects and modulates the bandwidth-limited frequency signal for acquisition of information data. In addition, the detection and demodulation portion 5 supplies the front end 2 with a gain control signal S. The gain control signal S specifies the gain corresponding to the received electrical field strength indicated by the aforementioned received electrical field strength signal. For example, the detection and demodulation portion 5 supplies the front end 2 with the gain control signal S that specifies the "low gain mode" when the received electrical field strength indicated by the received electrical field strength signal is greater than a predetermined electrical field strength. Conversely, when the received electrical field strength is smaller than the predetermined electrical field strength, the detection and demodulation portion 5 supplies the front end 2 with the gain control signal S that specifies the "high gain mode".

The front portion inside the front end 2 is mounted with the variable gain amplifier circuit according to the present invention. This circuit coverts the aforementioned received signal into an input signal $R_{IN}$ and amplifies the input signal $R_{IN}$ based on the gain specified by the aforementioned gain control signal S.

Figure 2:
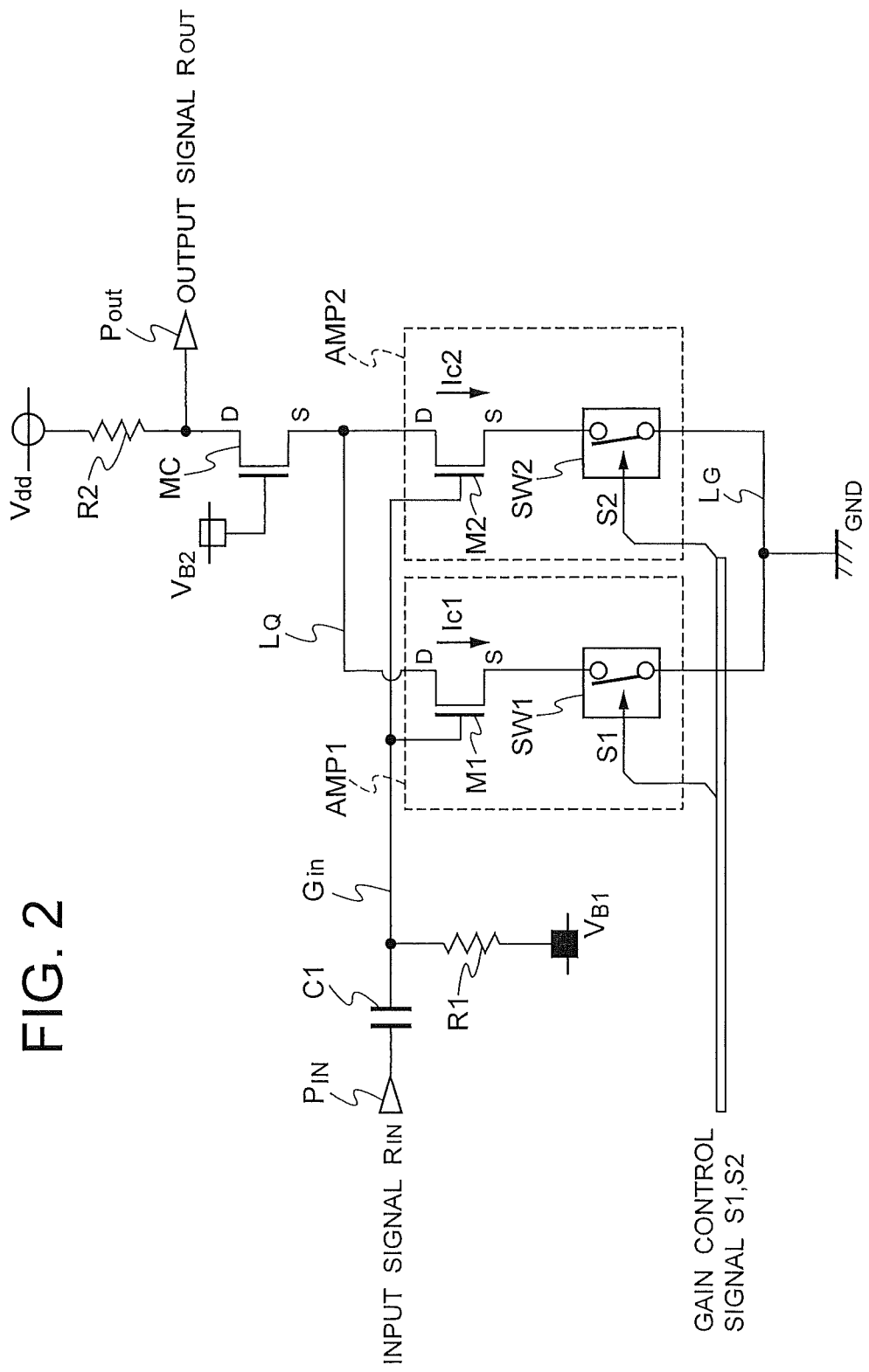
FIG. 2 is a circuit diagram illustrating one example of a variable gain amplifier circuit according to the present invention.

FIG. 2 is a circuit diagram illustrating one example of a variable gain amplifier circuit according to the present invention.

As illustrated in FIG. 2, the variable gain amplifier circuit includes a capacitor C1, resistors R1 and R2, and an output transistor MC, which is an n-channel-type MOSFET (Metal Oxide Semiconductor Field Effect Transistor). The variable gain amplifier circuit further includes, between an amplification coupling line $L_Q$ and a grounding line $L_G$, a first amplification portion AMP1 and a second amplification portion AMP2, which are connected with each other in parallel. The first amplification portion AMP1 includes a switching device SW1 and an amplification transistor M1, which is an n-channel-type MOSFET. The second amplification portion AMP2 includes a switching device SW2 and an amplification transistor M2, which is an n-channel-type MOSFET.

In FIG. 2, the capacitor C1 supplies a signal to the gate terminals, or the input signal terminals, of the amplification transistors M1 and M2 via an input signal line Gin. The signal thus supplied is produced by removing the low-region components of the input signal $R_{IN}$, which is supplied via an input terminal $P_{IN}$, from the input signal $R_{IN}$. The input signal line Gin is applied with a predetermined low voltage $V_{B1}$ via the resistor R1.

The drain terminals, or the current terminals, of the amplification transistors M1 and M2 are both connected to the amplification coupling line $L_Q$. The source terminal of the output transistor MC is connected to the aforementioned amplification coupling line $L_Q$, and a predetermined bias voltage $V_{B2}$ is constantly supplied to its gate terminal. The drain terminal of the output transistor MC is connected to an output terminal $P_{out}$, and a power source voltage Vdd is applied to the output terminal $P_{out}$ via the resistor R2.

The switching device SW1 is connected to the source terminal, or the current terminal, of the amplification transistor M1. To the other terminal of the switching device SW1, the grounding line $L_G$ is connected. Via the grounding line $L_G$, a grounding potential GND is constantly supplied to that other terminal.

When the switching device SW1 is supplied with a gain control signal S1 at a logic level of 1, which specifies the on state, the switching device SW1 is in the on state and applies the grounding potential GND to the source terminal of the amplification transistor M1. The switching device SW1 thereby induces the amplification current Ic1, which has been output from the amplification transistor M1, to flow between the amplification coupling line $L_Q$ and grounding line $L_G$. In other words, the amplification transistor M1 is activated. When the switching device SW1 is supplied with the gain control signal S1 at a logic level of 0, which specifies the off state, the switching device SW1 is in the off state and sets the source terminal of the amplification transistor M1 to a floating state, or a high-impedance state. Specifically, in response to the gain control signal S1 at a logic level of 0, which specifies the off state, the switching device SW1 cuts off the current path between the amplification coupling line $L_Q$ and grounding line $L_G$. In other words, the amplification transistor M1 is deactivated.

The switching device SW2 is connected to the source terminal, or the current terminal, of the amplification transistor M2. To the other terminal of the switching device SW2, the grounding line $L_G$ is connected. Via the grounding line $L_G$, the grounding potential GND is constantly supplied to that other terminal. When the switching device SW2 is supplied with a gain control signal S2 at a logic level of 1, which specifies the on state, the switching device SW2 is in the on state and applies the grounding potential GND to the source terminal of the amplification transistor M2. The switching device SW2 thereby induces the amplification current Ic2, which has been output from the aforementioned amplification transistor M2, to flow between the amplification coupling line $L_Q$ and the grounding line $L_G$. In other words, the amplification transistor M2 is activated. When the switching device SW2 is supplied with the gain control signal S2 at a logic level of 0, which specifies the off state, the switching device SW2 is in the off state and sets the source terminal of the amplification transistor M2 to a floating state, or a high-impedance state. Specifically, in response to the gain control signal S2 at a logic level of 0, which specifies the off state, the switching device SW2 cuts off the current path between the amplification coupling line $L_Q$ and grounding line $L_G$. In other words, the amplification transistor M2 is deactivated.

In the next example, the operation of the aforementioned variable gain amplifier circuit changed between the two modes, the "low gain mode" and the "high gain mode", is explained.

When the aforementioned variable gain amplifier circuit illustrated in FIG. 2 operates in the "low gain mode", it is supplied with the gain control signals S1 and S2 of the following values:

S1=1; and
S2=0.

As a result, the switching device S1 is in the on state, and the switching device S2 is in the off state. Of the amplification transistors M1 and M2, the amplification transistor M1 is activated. Only the amplification transistor M1 generates the amplification current Ic1 in response to an input signal supplied via the input signal line Gin and induces the generated amplification current Ic1 to flow between its source and drain terminals. Meanwhile, as the amplification transistor M2 is in the deactivated state, only the amplification current Ic1 generated by the amplification transistor M1 flows to the output terminal $P_{out}$ via the output transistor MC.

In the "low gain mode", the output signal $R_{out}$ is sent out via the output terminal $P_{out}$. The output signal $R_{out}$ corresponds to the amplification current Ic1, which is acquired by amplification of an input signal by the amplification transistor M1 alone, but not by the amplification transistors M1 and M2.

When the variable gain amplifier circuit illustrated in FIG. 2 operates in the "high gain mode", it is supplied with the gain control signals S1 and S2 of the following values:

S1=1; and
S2=1.

As a result, the switching devices S1 and S2 alike are in the on state, and both of the amplification transistors M1 and M2 are activated. Meanwhile, the amplification transistor M1 generates the amplification current Ic1 in response to an input signal supplied via the input signal line Gin and induces the generated amplification current Ic1 to flow between its source and drain terminals. The amplification transistor M2 generates the amplification current Ic2 in response to an input signal supplied via the input signal line Gin and induces the generated amplification current Ic2 to flow between its source and drain terminals. A summed current (Ic1+Ic2), i.e., a sum of the amplification current Ic1 generated by the amplification transistor, M1 and the amplification current Ic2 generated by the amplification transistor M2, flows to the output terminal $P_{out}$ via the output transistor MC.

In the "high gain mode", the output signal $R_{out}$ is sent out via the output terminal $P_{out}$. Here, the output signal $R_{out}$ corresponds to the sum of the amplification currents (Ic1+Ic2), which are acquired by amplification performed by the amplification transistors M1 and M2 alike.

The variable gain amplifier circuit of FIG. 2 is disposed with a plurality of amplification transistors for amplifying an input signal. The gain is varied by changing the number of amplification transistors among the plurality of amplification transistors that are set to the deactivated or activated state.

In the variable gain amplifier circuit of FIG. 2, the switching devices SW1 and SW2 are provided between the grounding line $L_G$ and the source terminals of the amplification transistors M1 and M2 so as to set the amplification transistors M1 and M2 to either the deactivated or activated state. The switching devices SW1 and SW2 close the current path between the amplification coupling line $L_O$ and the grounding line $L_G$ during the on state and cut off the current path during the off state.

No switching device for setting an amplification transistor to the deactivated state exists in the input signal path (the input signal line Gin), through which an input signal is transmitted to the respective amplification transistors. Thus, the input signal level is not attenuated by the on resistance or parasitic capacitance that would have been produced by a switching device.

As well, in the variable gain amplifier circuit of FIG. 2, even when the gain is varied, changes in the input impedance caused thereby are small as the input line Gin, through which the input signal $R_{IN}$ is transmitted, is connected directly to the gate terminals of all the amplification transistors. Compared with a variable gain amplifier circuit whose input impedance greatly changes depending on the gain, the error between the actual gain at the time of amplification by an amplification transistor and the design gain is smaller. More accurate gain adjustment can be made in the variable gain amplifier circuit of FIG. 2.

In the embodiment illustrated in FIG. 2, the switches SW1 and SW2 for setting amplification transistors to the deactivated or activated state are provided between the source terminals of the amplification transistors M1 and M2 and the grounding line $L_G$. However, the present invention is not limited to such a configuration.

Figure 3:
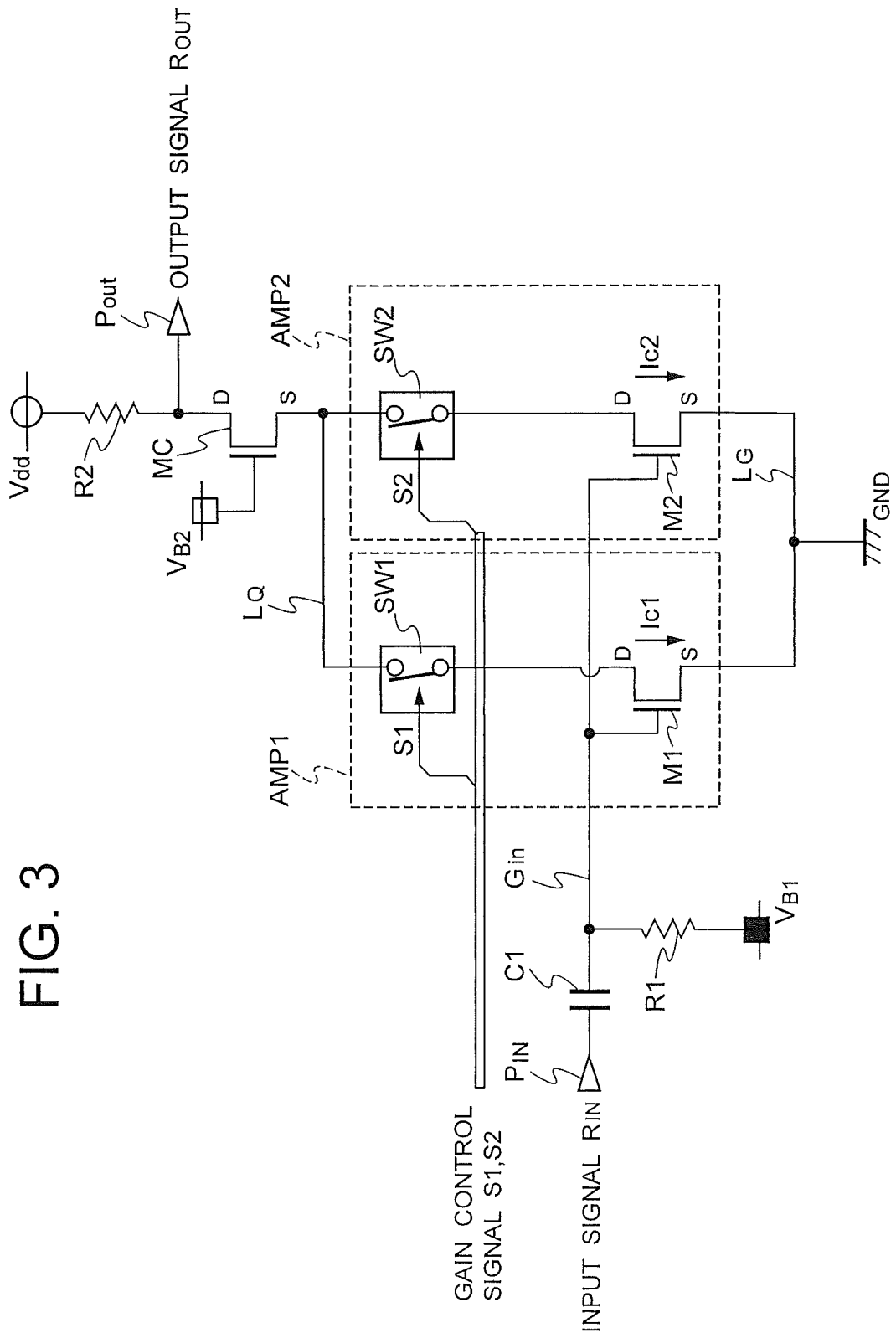
FIG. 3 is a circuit diagram illustrating a modified example of the variable gain amplifier circuit of FIG. 2.

For example, as illustrated in FIG. 3, the switching device SW1 (SW2) may be disposed between the amplification coupling line $L_O$ and the amplification transistor M1 (M2). In this configuration, the source terminals of the amplification transistors M1 and M2 are connected directly to the grounding line $L_G$.

When, e.g., MOSFETs are used as the switching devices SW1 and SW2, level attenuation occurs due to the parasitic capacitance and the on resistance, which is produced between the source and drain terminals during the on state. To address the level attenuation caused by installation of such switches, it is preferable to, as illustrated in FIG. 2, dispose the switching devices SW1 and SW2 between the source terminals of the amplification transistors M1 and M2 and the grounding line $L_G$.

Figure 4:
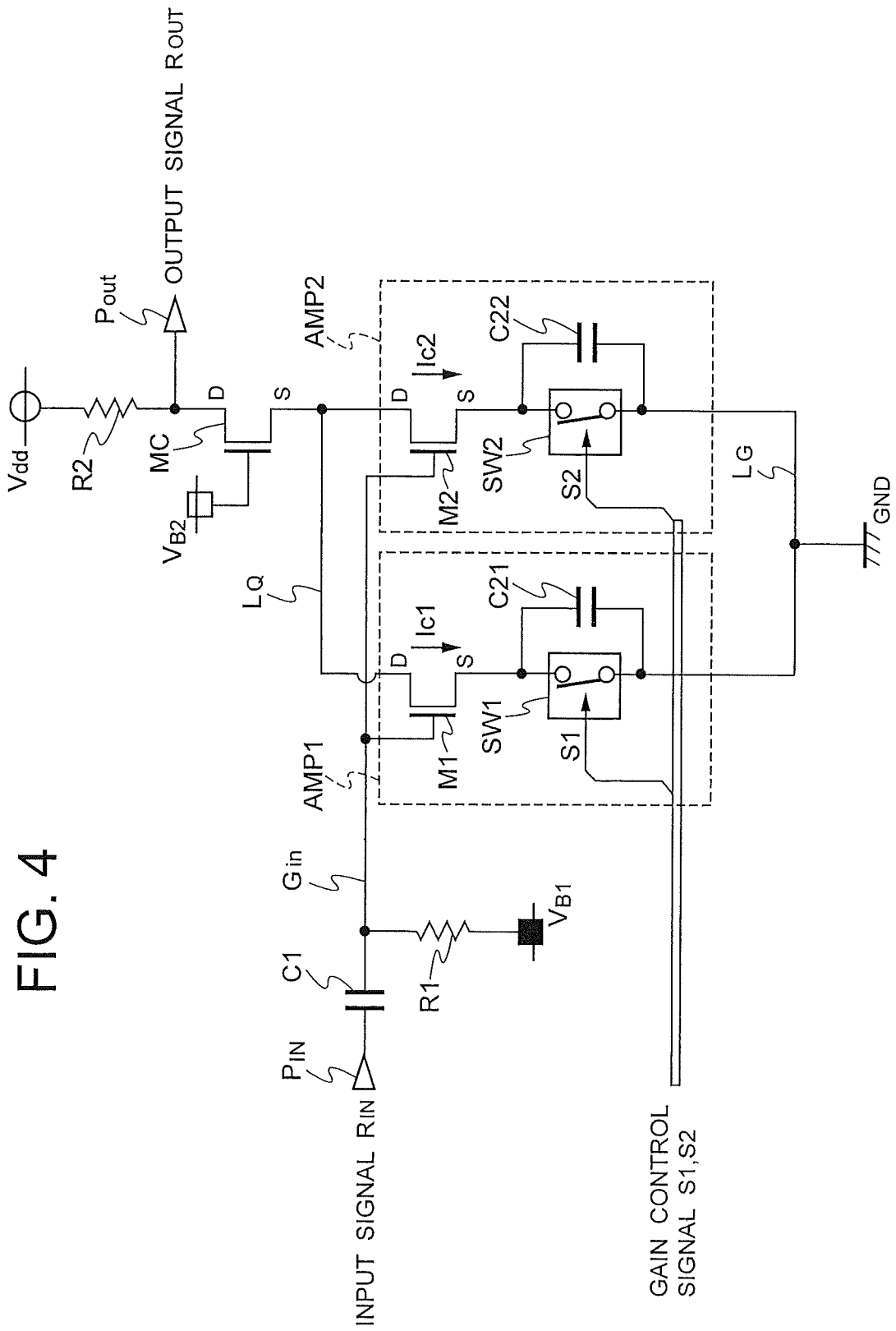
FIG. 4 is a circuit diagram illustrating another configuration of the variable gain amplifier circuit.

As illustrated in FIG. 4, the capacitor C21 (C22) is disposed in parallel with the switching device SW1 (SW2). Compared with the configuration of FIG. 2, changes in the input impedance due to the varied gain can be more readily reduced.

In the configuration of FIG. 2, the input capacitance during the on state of the switching device SW1 (SW2), i.e., the input capacitance during the activated state of the amplification transistor M1 (M2), contains the parasitic capacitance $C_{GS}$ between the gate and source terminals of the amplification transistor. However, during the off state of the switching device SW1 (SW2), i.e., during the deactivated state of the amplification transistor M1 (M2), the source terminal of this amplification transistor is open, and the effect of the parasitic capacitance is absent. Therefore, the input impedance is different between the activated and deactivated states of the amplification transistor M1 (M2).

When the capacitor C21 (C22) is disposed in parallel with the switching device SW1 (SW2), as illustrated in FIG. 4, the input capacitance during the deactivated state of the amplification transistor M1 (M2) contains the resultant serial capacitance. This resultant serial capacitance is resulted from the parasitic capacitance $C_{GS}$ between the gate and source terminals of the amplification transistor and the capacitance of the capacitor C21 (C22). The input capacitance during the deactivated state of the amplification transistor is thereby approximated to the input capacitance in the activated state, i.e., the parasitic capacitance $C_{GS}$ between the gate and source terminals of the amplification transistor. Accordingly, changes in the input impedance difference are small between the activated and deactivated states of the amplification transistor.

When the configuration of FIG. 4 is adopted in a variable gain amplifier circuit, the error between the actual gain at the time of amplification by an amplification transistor and the design gain is smaller compared with the error therebetween in the configuration of FIG. 2. Thus, more accurate gain adjustment can be made in the variable gain amplifier circuit of FIG. 4.

In the configuration of FIG. 4, a resultant serial capacitance is resulted from the parasitic capacitance $C_{GS}$ between the gate and source terminals of an amplification transistor during the off state of the switching device SW1 (SW2) and the capacitance of the capacitor C21 (C22). When the capacitance of the capacitor C21 (C22) is set so that the resultant serial capacitance is equal to the parasitic capacitance $C_{GS}$ during the on state of the switching device SW1 (SW2), the input impedance change can be substantially zero between the activated and deactivated states of the amplification transistor. In this manner, even more accurate gain adjustment is possible in the variable gain amplifier circuit of FIG. 4.

In the embodiments shown in FIGS. 2 to 4, two amplification portions AMP1 and AMP2 are connected in parallel between the amplification coupling line $L_Q$ and the grounding line $L_G$. However, more than two amplification portions may be connected in parallel between the amplification coupling line $L_Q$ and the grounding line $L_G$.

As well, in the embodiments shown in FIGS. 2 to 4, the output transistor MC and the amplification transistors M1 and M2 are MOS transistors. However, they may be bipolar transistors.

As the output transistor MC and the amplification transistors M1 and M2, MOS or bipolar transistors may be used. By such MOS or bipolar transistors, a current corresponding to an input signal that has been supplied to the input signal terminal (base, gate) is induced to flow between two current terminals (drain, source, collector, emitter).

In addition, the switching devices SW1 and SW2 may be MOS or bipolar transistors.

This application is based on Japanese Patent Application No. 2011-029566 which is incorporated herein by reference.

What is claimed is:

1. A variable gain amplifier circuit for sending out, via an output terminal, a signal that is obtained by amplifying an input signal supplied via an input terminal, the variable gain amplifier circuit comprising:
a plurality of amplification portions provided in parallel between an amplification coupling line and a grounding line
each of the amplification portions including a switching device connected between the amplification coupling line and the grounding line and an amplification transistor including an input terminal that is connected to the input terminal, the amplification transistor inducing a current corresponding to the input signal to flow between the amplification coupling line and the grounding line according to the switching device when the switching device is in an on state,
a gain of each of the amplification portions being varied by setting the switching device to the on state or an off state according to a gain control signal; and
an output portion including an output transistor connected between the amplification coupling line and the output terminal, the output portion sending out a signal according to a bias voltage to the output terminal.

2. The variable gain amplifier circuit according to claim 1, wherein:
one of two current terminals of the amplification transistor other than the input signal terminal is connected to the amplification coupling line; and
the switching device is disposed between another of the current terminals of the amplification transistor and the grounding line.

3. The variable gain amplifier circuit according to claim 2, wherein the switching device and a capacitor are connected in parallel.

4. The variable gain amplifier circuit according to claim 1, wherein:
one of two current terminals of the amplification transistor is connected to the grounding line; and
the switching device is disposed between another of the current terminals of the amplification transistor and the amplification coupling line.

5. A variable gain amplifier circuit, the circuit using a plurality of amplification portions for amplification of an input signal to a desired level and outputting an output signal thus amplified, wherein:
the amplification portions are connected with each other in parallel, and each of the amplification portions comprises an amplification transistor and a switching device between an integrated amplification line, through which power supply is received from a power source, and a grounding line;
the variable gain amplifier circuit further comprises an output portion including an output transistor connected between the integrated amplification line and an output terminal, the output portion sending out the output signal according to a bias voltage to the output terminal;
a level of the output signal is determined according to an amount of a current flowing through the integrated amplification line;
the amplification transistor induces a current to flow through the integrated amplification line according to the input signal thus supplied; and
to perform the amplification, the switching device is switched on and off to adjust an electrical connection between the integrated amplification line and the grounding line so as to adjust an amount of the current flowing through the integrated amplification line.

6. The variable gain amplifier circuit according to claim 5, wherein:
the amplification transistor is connected to the integrated amplification line; and
the switching device is connected between the amplification transistor and the grounding line.

7. The variable gain amplifier circuit according to claim 6, wherein the switching device and a capacitative device are connected with each other in parallel.

8. The variable gain amplifier circuit according to claim 7, wherein:
the capacitative device is set to a capacitance where a resultant serial capacitance resulted from the capacitance of the capacitative device and a parasitic capacitance between a gate and a source of the amplification transistor during an off state of the switching device is equal to the parasitic capacitance during an on state of the switching device.

9. The variable gain amplifier circuit according to claim 5, further comprising:
an input terminal that is connected to a control terminal which controls a driving ability of the amplification transistor and receives the input signal; and
an output terminal that is connected to the integrated amplification line and outputs the output signal.

10. The variable gain amplifier circuit according to claim 9, wherein:
   the amplification transistor is a MOS transistor; and
   the control terminal is the gate of the amplification transistor.

11. The variable gain amplifier circuit according to claim 9, wherein:
   the amplification transistor is a bipolar transistor; and
   the control terminal is a base of the amplification transistor.

12. The variable gain amplifier circuit according to claim 5, wherein the switching device is a MOS transistor.

13. The variable gain amplifier circuit according to claim 5, wherein the switching device is a bipolar transistor.

14. The variable gain amplifier circuit according to claim 5, wherein the amplification transistor and the switching device are connected in series.

15. The variable gain amplifier circuit according to claim 5, further comprising a control portion for outputting a control signal for controlling on and off of the switching device.

16. A variable gain amplifier circuit for sending out, via an output terminal, a signal that is obtained by amplifying an input signal supplied via an input terminal, the variable gain amplifier circuit comprising:
   a plurality of amplification portions provided in parallel between an amplification coupling line and a grounding line; and
   an output portion that sends out a signal on the amplification coupling line to the output terminal, wherein
   each of the amplification portions includes a switching device connected between the amplification coupling line and the grounding line and an amplification transistor, the amplification transistor inducing a current corresponding to the input signal to flow between the amplification coupling line and the grounding line via the switching device when the switching device is in an on state,
   the amplification transistor includes an input signal terminal that is connected to the input terminal, and a gain of the amplification transistor is varied by setting the switching device to the on state or an off state according to a gain control signal,
   one of two current terminals of the amplification transistor other than the input signal terminal is connected to the amplification coupling line, and wherein
   the switching device is disposed between another of the current terminals of the amplification transistor and the grounding line.

17. The variable gain amplifier circuit according to claim 16, wherein the switching device and a capacitor are connected in parallel.

18. A variable gain amplifier circuit, the circuit using a plurality of amplification portions for amplification of an input signal to a desired level and outputting an output signal thus amplified, wherein:
   the amplification portions are connected with each other in parallel, and each of the amplification portions comprises an amplification transistor and a switching device between an integrated amplification line, through which power supply is received from a power source and the output signal is output, and a grounding line;
   a level of the output signal is determined according to an amount of a current flowing through the integrated amplification line;
   the amplification transistor induces a current to flow through the integrated amplification line according to the input signal thus supplied;
   to perform the amplification, the switching device is switched on and off to adjust an electrical connection between the integrated amplification line and the grounding line so as to adjust an amount of the current flowing through the integrated amplification line;
   the amplification transistor is connected to the integrated amplification line; and wherein
   the switching device is connected between the amplification transistor and the grounding line.

19. The variable gain amplifier circuit according to claim 18, wherein the switching device and a capacitive device are connected with each other in parallel.

20. The variable gain amplifier circuit according to claim 19, wherein:
   the capacitive device is set to a capacitance where a resultant serial capacitance resulted from the capacitance of the capacitive device and a parasitic capacitance between a gate and a source of the amplification transistor during an off state of the switching device is equal to the parasitic capacitance during an on state of the switching device.

* * * * *